US010205011B2

(12) United States Patent
Schulze et al.

(10) Patent No.: US 10,205,011 B2
(45) Date of Patent: Feb. 12, 2019

(54) METHOD FOR FORMING A SEMICONDUCTOR DEVICE WITH IMPLANTED CHALCOGEN ATOMS

(71) Applicant: Infineon Technologies AG, Neubiberg (DE)

(72) Inventors: Hans-Joachim Schulze, Taufkirchen (DE); Philip Christoph Brandt, Oberhaching (DE); Andre Rainer Stegner, Munich (DE)

(73) Assignee: Infineon Technologies AG, Neubiberg (DE)

( * ) Notice: Subject to any disclaimer, the term of this patent is extended or adjusted under 35 U.S.C. 154(b) by 259 days.

(21) Appl. No.: 15/043,084

(22) Filed: Feb. 12, 2016

(65) Prior Publication Data

US 2016/0240642 A1    Aug. 18, 2016

(30) Foreign Application Priority Data

Feb. 13, 2015   (DE) .................. 10 2015 102 130

(51) Int. Cl.
| | | |
|---|---|---|
| H01L 21/265 | (2006.01) |
| H01L 29/739 | (2006.01) |
| H01L 29/66 | (2006.01) |
| H01L 29/10 | (2006.01) |
| H01L 29/167 | (2006.01) |
| H01L 21/22 | (2006.01) |
| H01L 21/24 | (2006.01) |
| H01L 21/266 | (2006.01) |

(Continued)

(52) U.S. Cl.
CPC .......... *H01L 29/7397* (2013.01); *H01L 21/22* (2013.01); *H01L 21/24* (2013.01); *H01L 21/266* (2013.01); *H01L 21/26506* (2013.01); *H01L 29/1095* (2013.01); *H01L 29/167* (2013.01); *H01L 29/66348* (2013.01); *H01L 21/26586* (2013.01); *H01L 29/0619* (2013.01); *H01L 29/456* (2013.01)

(58) Field of Classification Search
CPC ......... H01L 21/26506; H01L 21/26586; H01L 21/266; H01L 21/22; H01L 21/24
See application file for complete search history.

(56) References Cited

U.S. PATENT DOCUMENTS

| | | | | |
|---|---|---|---|---|
| 6,274,447 B1 * | 8/2001 | Takasou | ............ | H01L 21/26506 438/305 |
| 2010/0035366 A1 * | 2/2010 | Doehnel | ........... | H01L 29/66727 438/5 |
| 2012/0037955 A1 | 2/2012 | Hirler et al. | | |

FOREIGN PATENT DOCUMENTS

| | | |
|---|---|---|
| CN | 102201437 A | 9/2011 |
| DE | 10261374 A1 | 7/2004 |
| DE | 10217610 B4 | 11/2005 |

(Continued)

*Primary Examiner* — Matthew E Warren
(74) *Attorney, Agent, or Firm* — Murphy, Bilak & Homiller, PLLC

(57) ABSTRACT

Some embodiments relate to a method for forming a semiconductor device. The method includes forming a source region of a field effect transistor structure in a semiconductor substrate. The method further includes forming an oxide layer. The method also includes incorporating atoms of at least one atom type of a group of atom types into at least a part of the source region of the field effect transistor structure after forming the oxide layer. The group of atom types includes chalcogen atoms, silicon atoms and argon atoms.

13 Claims, 5 Drawing Sheets

(51) Int. Cl.
  *H01L 29/45* (2006.01)
  *H01L 29/06* (2006.01)

(56) References Cited

FOREIGN PATENT DOCUMENTS

DE 112006001697 T5 5/2008
DE 102013209685 A1 12/2013

* cited by examiner

METHOD FOR FORMING A SEMICONDUCTOR DEVICE WITH IMPLANTED CHALCOGEN ATOMS

PRIORITY CLAIM

This application claims priority to German Patent Application No. 10 2015 102 130.7 filed on 13 Feb. 2015, the content of the application incorporated herein by reference in its entirety.

TECHNICAL FIELD

Embodiments relate to concepts for transistor structures and in particular to semiconductor devices and a method for forming a semiconductor device.

BACKGROUND

It is desired to improve the latch-up, over-current and cosmic radiation robustness of semiconductor devices, as semiconductor devices, e.g. field effect transistors, e.g. insulated gate bipolar transistors (IGBT) may suffer from challenges related to latch-up, over-current and cosmic radiation.

SUMMARY

Some embodiments relate to a method for forming a semiconductor device. The method includes forming a source region of a field effect transistor structure in a semiconductor substrate. The method further includes forming an oxide layer. The method further includes incorporating atoms of at least one atom type of a group of atom types into at least a part of the source region of the field effect transistor structure after forming the oxide layer. The group of atom types includes chalcogen atoms, silicon atoms and argon atoms.

Some embodiments relate to a semiconductor device. The semiconductor device includes a body region of a field effect transistor structure formed between a drift region of the field effect transistor structure and a source region of the field effect transistor structure. The semiconductor substrate includes chalcogen atoms at an atom concentration of less than $1\times10^{13}$ cm$^{-3}$ at a p-n junction between the body region and the drift region. At least part of the source region includes the chalcogen atoms at an atom concentration of greater than $1\times10^{13}$ cm$^{-3}$.

Some embodiments relate to a further semiconductor device. The semiconductor device includes a body region of a field effect transistor structure formed in a semiconductor substrate and a source region formed adjacent to the body region. At least part of the source region includes chalcogen atoms at an atom concentration of greater than $1\times10^{13}$ cm$^{-3}$. The semiconductor device further includes a contact trench extending into the semiconductor substrate. The semiconductor device further includes an electrode structure formed in the contact trench. The electrode structure is in contact with the body region at the bottom of the contact trench and in contact with the source region at a sidewall of the contact trench.

Those skilled in the art will recognise additional features and advantages upon reading the following detailed description, and upon viewing the accompanying drawings.

BRIEF DESCRIPTION OF THE FIGURES

Some embodiments of apparatuses and/or methods will be described in the following by way of example only, and with reference to the accompanying figures, in which.

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

Figure 1A:
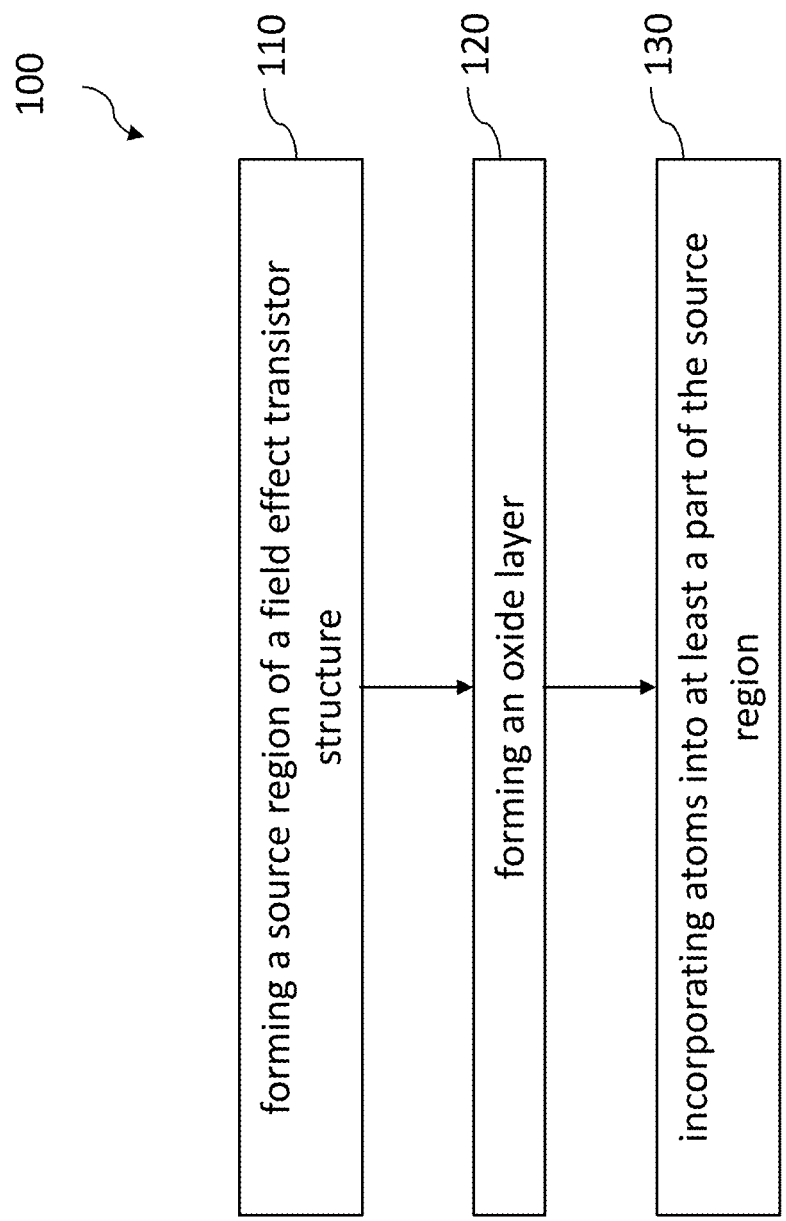
FIG. 1A shows a flow chart of a method for forming a semiconductor device according to various embodiments.

FIG. 1A shows a flow chart of a method 100 for forming a semiconductor device according to an embodiment.

The method 100 includes forming 110 a source region of a field effect transistor structure in a semiconductor substrate.

The method 100 further includes forming 120 an oxide layer.

The method 100 further includes incorporating 130 atoms of at least one atom type of a group of atom types into at least a part of the source region of the field effect transistor structure after forming the oxide layer. The group of atom types includes chalcogen atoms, silicon atoms and argon atoms.

Due to the incorporation of atoms (of the at least one atom type from the group of atom types) into the source region after forming the oxide layer, latch-up robustness and blocking capabilities of the field effect transistor structure may be improved. For example, the incorporation of atoms after forming the oxide layer allows for the atoms to avoid high temperature (greater than 900° C.) processes associated with the formation of the oxide layer, and therefore the number of atoms spreading deeply into the semiconductor substrate, e.g. into a drift zone, may be reduced.

The source region of the FET structure may be formed 110 by incorporating dopant atoms of a first dopant type into a region of the semiconductor substrate before forming the oxide layer, for example. The dopant atoms of the first dopant type may be incorporated by implantation e.g. ion implantation and/or diffusion of atoms from at least part of a (front main) surface of the semiconductor substrate, for example.

Dopant atoms may be either donor atoms (forming n-type regions when incorporated in a semiconductor substrate) or acceptor atoms (leading p-type regions when incorporated in the semiconductor substrate), for example. Dopant atoms of the first dopant type may refer to donor atoms and dopant atoms of a second dopant type may refer to acceptor atoms in the examples described herein, for example.

The dopant atoms of the first dopant type (donors) may be incorporated into the source region so that a source region of a first conductivity type (e.g. n-type) is formed in the semiconductor substrate, for example. The dopant atoms of the first dopant type may include elements (or atoms) from group V of the periodic table, e.g. phosphorus (P) and/or Arsenic (As), for example.

The oxide layer, (e.g. an intermediate oxide layer) may be a silicate glass (SG), a phosphosilicate glass (PSG) layer, a borosilicate glass (BSG) layer or a phosphoborosilicate glass (PBSG) layer or a stack of such layers, for example.

The oxide layer may be formed on a surface of the source region, e.g. on at least part of the source region, for example. Furthermore, the oxide layer may be formed over or below other parts of the FET structure, e.g. over a gate electrode structure and/or other metallization layers formed at a front main surface of the semiconductor substrate, for example.

The method 100 may further include tempering the oxide layer at a temperature of more than 900° C. before incorporating the atoms of the at least one atom type, for example. In this way, edges or uneven topology of the oxide layer due to the topology of the structures below the oxide layer may be smoothed.

After forming the oxide layer, the atoms of the at least one atom type may be incorporated into the source region by implanting the atoms into the source region. Optionally, the atoms may be implanted at an oblique implantation angle (e.g. between 1° and 70° or between 2° and 50° or between 5° and 30°), with respect to a main surface of the semiconductor substrate. For example, the atoms of the at least one atom type may be implanted into sidewalls of the contact trench by using a tilted implant.

More than 50% (e.g. more than 75% or e.g. more than 90%) of the incorporated atoms (of the at least one atom type) may be incorporated into a surface region of the source region. For example, the surface region may have a thickness of less than 150 nm, e.g. between 10 nm to 120 nm, e.g. 100 nm. In other words, the surface region may extend into the source region from the surface of entry of the atoms by less than 150 nm, e.g. between 10 nm to 120 nm, e.g. 100 nm.

The atom types in the group of atom types include chalcogen atoms such as sulfur (S), selenium (Se) and tellurium (Te). Other atom types in the group of atom types include silicon (Si) atoms and argon (Ar) atoms. The atom types in the group of atom types are atoms which exhibit mainly electrically inactive behavior when incorporated into the (silicon) semiconductor substrate, e.g. by forming mainly electrically inactive clusters or defects in the silicon lattice. Mainly electrically inactive in this context means that these atoms are less effective as donors but are effective as defects with deep energy levels in the band gap of the semiconductor so that they can avoid a significant contact resistance due to Schottky effects.

For example, the semiconductor substrate may be a silicon-based semiconductor substrate. In other examples, the semiconductor substrate may be a silicon carbide-based semiconductor substrate, or gallium arsenide-based semiconductor substrate or gallium nitride-based semiconductor substrate, for example.

The semiconductor substrate may include a semiconductor substrate front side and a semiconductor substrate back side. In comparison to a basically vertical edge of the semiconductor substrate, the main surface or front side of the semiconductor substrate may be a basically horizontal surface extending laterally.

The main surface of a substrate may be a substantially even plane (e.g. neglecting unevenness of the semiconductor structure due to the manufacturing process and trenches). For example, the lateral dimension of the main surface of the substrate may be more than 100 times larger (or more than 1000 times or more than 10000 times) than a maximal height of structures on the main surface.

The FET structure may be a metal oxide semiconductor field effect transistor (MOSFET) or an insulated gate bipolar transistor (IGBT), for example. For example, the semiconductor device may be a power semiconductor device with a blocking voltage which lies between 600 V and 8000V (e.g. more than 700 V, more than 1000V or more than 1500V). In some examples, the semiconductor device may have on-state current carrying capability which is greater than 10 A, greater than 500 A or greater than 1000 A, for example. In other examples, the semiconductor device may be power device having a blocking voltage of between 500V to 900 V, (e.g. a CoolMOS™ device), for example.

Alternatively or optionally, the method 100 may include etching a contact trench into the semiconductor substrate before incorporating the atoms of the at least one atom type. For example, the etching of the semiconductor substrate may include etching (e.g. removing) a portion of a source region formed in the semiconductor substrate. The etching of the semiconductor substrate may also include etching a portion of a body region formed in the semiconductor substrate, for example. At least part of the source region and at least part of the body region remains in the semiconductor substrate after etching.

For example, the etching (or removal) of the portion of the source region of the semiconductor substrate may leave at least part of the remaining source region and the body region exposed. The exposed source region may be a surface of entry of the atoms during the incorporation of the atoms into the source region, for example.

The etching of the contact trench may result in a portion of the source region being etched, and the remaining parts of the source region in the semiconductor substrate defining the at least part of the sidewalls of the contact trench. For example, the contact trench may include at least one sidewall of the source region at a side of the contact trench. The etching of the source region and/or the body region may expose the body region at a bottom of the contact trench. The etching of the semiconductor substrate may result in a surface of the source region forming at least a part of a sidewall of the contact trench and a surface of the body region of the semiconductor substrate forming at least a part of a bottom of the etched contact trench.

Additionally or optionally, the method 100 may also include etching at least part of the oxide layer before etching the semiconductor substrate to from the contact trench. The etching of the oxide layer may be carried out followed by etching of the source region to form the contact trench.

For example, the method 100 may further include forming the body region of the FET structure in the semiconductor substrate, (e.g. before incorporating the atoms of the at least one atom type). For example, the body region may be formed before forming the source region of the FET structure, for example. The body region of the FET structure may be formed by incorporating dopant atoms of a second dopant type into a region of the semiconductor substrate before forming the oxide layer. The dopant atoms of the second dopant type may be incorporated by implantation (e.g. ion implantation) and/or diffusion of atoms from at least part of a (front main) surface of the semiconductor substrate. The concentration of the body region may lie between $5 \times 10^{16}$ cm$^{-3}$ and $1 \times 10^{18}$ cm$^{-3}$, (e.g. about $2 \times 10^{17}$ cm$^{-3}$).

The dopant atoms of the second dopant type (acceptors) may be incorporated into the body region so that a body region of a second conductivity type (e.g. p-type) is formed in the semiconductor substrate. The dopant atoms of the second dopant type may include elements (or atoms) from group III of the periodic table, e.g. boron (B) and/or aluminum (Al), for example. Additionally, optionally or alternatively, also other dopant atoms of the second dopant type may be used for semiconductor substrates as gallium nitride (GaN), for example.

The source region formed in the semiconductor substrate may be formed adjacent to the body region. For example, the source region (before etching and before incorporating the atoms of the at least one atom type) may lie above the body region (e.g. closer to the front main surface of the semiconductor substrate than the body region) in the semiconductor substrate.

Additionally, alternatively or optionally, the method 100 may further include removing a part of the body region comprising (unwanted) atoms of the at least one atom type from the bottom of the contact trench. For example, this may be carried out by etching at least part of the body region at the bottom of the contact trench after incorporating the atoms of the at least one atom type. Additionally, alternatively or optionally, further dopant atoms of the second dopant type may be incorporated into the body region at the bottom of the contact trench after incorporating the atoms of the at least one atom type. With a suitable front design, method 100 may also omit the additional local increase in the body doping, which may lead to a reduction of latch-up, for example.

Additionally, alternatively or optionally, the method 100 may further include forming other parts of the FET structure such as a drift region, a float region, a field stop region and/or an emitter region in the semiconductor substrate, and an insulation structure, gate electrode, a source electrode and a drain electrode at the semiconductor substrate. Some of these processes, e.g. forming the float region, the insulation structure and the gate electrode layer may be carried out before incorporating the atoms of the at least one atom type. Some of these processes, e.g. forming the drift region, the field stop region, the emitter region and the drain electrode may be carried out before or after incorporating the atoms of the at least one atom type. The float region may be formed before formation of the source region, for example.

For example, all processes after incorporating the atoms of the at least one atom type are performed at temperatures below 800° C. or below 700° C., which may reduce or prevent spreading of the incorporated atoms of the at least one type into other regions of the semiconductor device.

Alternatively or optionally, forming the drift region of the FET structure may include forming a lightly doped region of the first conductivity type (e.g. n) or the semiconductor substrate may be provided with a doping concentration suitable for the drift region. The drift region may surround or be adjacent to at least part of the body region. For example, the body region may lie above the drift region. The drift region may lie between the body region and a back main surface of the semiconductor substrate, for example. For example, the drift region may lie between the body region and a drain electrode of the FET structure.

Alternatively or optionally, forming the emitter region may include forming the emitter region between the drift region and the drain electrode formed at the back side of the semiconductor substrate, for example. The emitter region may include a doped region of the second conductivity type (e.g. p$^+$) formed at the back side surface of the semiconductor substrate.

Alternatively or optionally, the method 100 may include forming a drain electrode (or a back side metallization layer) on or adjacent to the emitter region at the back surface of the semiconductor substrate.

Furthermore, the method 100 may further include forming an electrode structure (e.g. a source electrode) at the front surface of the semiconductor substrate. For example, the source electrode structure may be formed adjacent to and in contact with the source region and the body region. Optionally, the source electrode structure may be formed over at least part of the oxide layer or between the oxide layer and the semiconductor substrate, for example.

The method 100 may further include forming a gate trench in the semiconductor substrate. The gate trench may be formed adjacent to the source region and the body region in the semiconductor substrate, for example. For example, the gate trench may extend into the semiconductor substrate from a front main surface of the semiconductor substrate so that the gate trench is adjacent to the drift region and the float region.

The method 100 may further include or further includes forming a gate insulation layer on the surfaces of the gate trench. The gate insulation layer may include an electrically insulating material, e.g. silicon dioxide or silicon nitride.

The method 100 may further include forming a gate electrode structure on (e.g. covering) the gate insulation layer. For example, at least part of the gate electrode structure may be formed in the gate trench, so that the gate insulation layer is located between the gate electrode and the semiconductor substrate.

The method 100 may further include forming a float region in the semiconductor substrate, e.g. before incorporating the atoms of the at least one atom type). The float region may comprise a doped region of the second conductivity type (e.g. p-type). The float region may be formed adjacent to the gate trench opposite to the body region. At least part of the float region may be formed at the front main surface of the semiconductor substrate. The float region may extend from the main front surface to a depth deeper than the body region and/or an adjacent gate trench.

The method 100 may further include forming an insulation structure on or at least partially in the semiconductor substrate. For example, the insulation structure may be formed adjacent to and/or at least partially in the float region of the semiconductor substrate. In a non-limiting example, the insulation structure may be formed by a local oxidation of silicon (LOCOS) process, or by a thermal oxidation of the silicon substrate.

A further part of the gate electrode structure may also be formed on at least part of the semiconductor substrate, e.g. directly on the insulation structure.

The method may improve a latch-up robustness of power semiconductors through incorporation of atoms of the at least one atom type (e.g. of mainly electrically inactive atoms e.g. selenium incorporation) in addition to the source-diffusion (of mainly electrically active dopant atoms, e.g. P, As). Due to the incorporation of atoms of the at least one atom type after formation of the oxide layer, the spreading of atoms (e.g. selenium atoms) deep into the drift zone due to the relatively high diffusions constant in silicon at high reflowing temperatures (e.g. at temperatures of at least 900° C.) may be prevented or reduced. The atoms (e.g. the selenium atoms) may segregate and remain in the surface region of the source region instead. Incorporating the atoms of the at least one atom type (e.g. the additional selenium implantation in the semiconductor surface) with IGBT Power MOS processes at significant temperature processes (e.g. reflowing of the intermediate oxide layer at temperatures of at least 900° C.), may result in undesired deep diffusion or spreading of the atoms into the drift zone, and may negatively influence the blocking capabilities of the component since the maximum field strength may be significantly increased for a given blocking voltage. These challenges may be circumvented by the described concept, for example.

Furthermore, subsequent high process temperature processes after the implantation may be carried out at temperatures below 800° C. For examples, temperature processes related to stuffed barriers or rapid thermal annealing processes (e.g. at 740° C. for 30 s), may lead to no significant redistribution of the atoms (from the 100 nm surface region) due to the segregations effect of the selenium atoms. Therefore, a low contact resistance may be experienced even at low source doping, for example. The emitter efficiency of the selenium doping may be kept very low due to the segregations effect in combination with the low solubility and the low-lying energy levels, for example.

For example, the atoms of the at least one atom type are selenium atoms. Alternatively or additionally, the atoms may be other chalcogen atoms. Alternatively or additionally, sulfur atoms may be introduced in the contact holes. Additionally or alternatively, the contact hole side walls may be implanted with effective donors or electrically inactive atoms (e.g. Si, Ar). However, these may not necessarily have the segregations behavior of the selenium atoms, so in this case only a relatively low temperature and/or time budget for the annealing process may be allowed, for example.

The source electrode and/or the gate electrode may be formed with electrically conductive materials, e.g. aluminum (Al), titanium (Ti), titanium-tungsten (TiW), titanium nitride (TiN), tantalum nitride (TaN) or tungsten (W) may serve as front side metallization. For example, Al, Ti and/or TiW may serve as a first barrier layer, for example. Combinations of these materials may be used in addition to or alternatively to combinations with deposited power metallizations such as copper (Cu), nickel (Ni), chromium (Cr) and/or Silicides such as nickel silicide (NiSi) and/or platinum silicide (PtSi), for example.

Figure 1B:
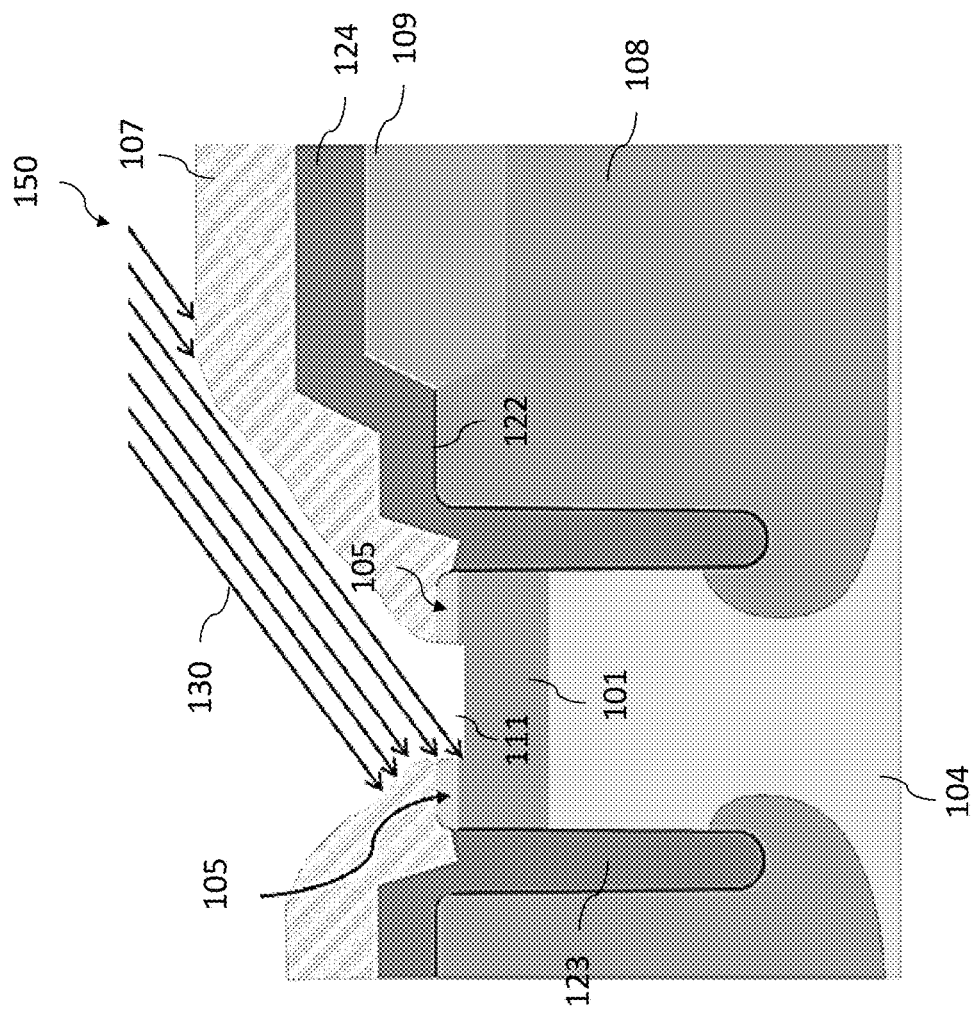
FIG. 1B shows a schematic illustration of at least part of a method for forming a semiconductor device according to various embodiments.

FIG. 1B shows a schematic illustration 150 of at least part of a method for forming a semiconductor device according to an embodiment.

FIG. 1B shows a source region 105 of a field effect transistor structure formed in a semiconductor substrate. FIG. 1B further shows the semiconductor device may also include a float region 108 (e.g. a p float region) in the semiconductor substrate, e.g. a doped region of the second conductivity type (e.g. p-type).

FIG. 1B further shows an insulation structure (e.g. a LOCOS region) 109 formed on or at least partially in the semiconductor substrate, and a gate insulation layer 122 formed on the surface of a gate trench 123 extending into the semiconductor substrate. A gate electrode structure 124 may be formed on the insulation structure 109 and the gate insulation layer 122, and at least part of the gate electrode structure 124 may be formed in the gate trench 123. The gate trench may be formed adjacent to the float region 108, the source region 105, the body region 101 (e.g. a p body region), and the drift region 104.

FIG. 1B further shows an oxide layer 107 (e.g. an intermediate oxide layer) formed on the gate electrode structure 124 and on the source region 105.

FIG. 1B shows the introduction or incorporation 130 of atoms of the first atom type (e.g. Se atoms) in the side walls of a contact trench 111 of the FET structure (e.g. an IGBT cell), after forming the oxide layer 107.

Through the introduction of atoms of the at least one atom type (e.g. Se atoms) in the sidewalls of the contact trench (after forming the oxide layer), the temperature stress or load following the implantation may be significantly reduced. Thus, an unwanted in-diffusion of atoms of the first atom type (e.g. Se atoms) into the drift zone of the power semiconductor component may be avoided or reduced. The atoms of the first atom type may be incorporated at an oblique implantation angle (shown by the arrows) between 1° and 70°, e.g. between 2° and 50°, e.g. about 45° with respect to the (horizontal) main surface of the semiconductor substrate.

Implantation doses for the atoms of the at least one atom type (e.g. Se atoms) may lie above $5 \times 10^{13}$ atoms per $cm^2$, e.g. in the range between $5 \times 10^{13}$ and $4 \times 10^{15}$ atoms per $cm^2$, or better between $1 \times 10^{14}$ and $8 \times 10^{14}$ atoms per $cm^2$ for example. The applied implantations energy may lie between 5 keV and 100 keV, e.g. between 10 keV and 70 keV.

The source region 105 may further include electrically active atoms of a first dopant type (e.g. P, As) at a doping concentration of less than $1 \times 10^{18}$ $cm^{-3}$, e.g. between $5 \times 10^{17}$ $cm^{-3}$ and $1 \times 10^{19}$ $cm^{-3}$. A ratio of the doping concentration of the atoms of the at least one atom type in the source region to the doping concentration of electrically active atoms of the first dopant type in the source region lies between 1:10 and 1:2 (e.g. between 10% and 50%), for example.

The body region 101 may include dopant atoms of a second dopant type (e.g. B, Al) at a doping concentration of $1 \times 10^{17}$ cm$^{-3}$.

The source region 105 may include an effective doping concentration (e.g. at the surface region or average over the source region) of not more than three times greater than an effective doping concentration (e.g. average effective doping concentration) of the body region 101. For example, the electrically active effective doping concentration $|N_D-N_A|$ of the source region may be lower than, approximately equal to or preferably not more than a factor of 3 times higher than the doping concentration of the adjacent body region, e.g. less than 80% higher, or e.g. less than 30% higher. For example, the effective doping concentration may lie between $1 \times 10^{16}$ and $2 \times 10^{18}$ cm$^{-3}$ or between $5 \times 10^{16}$ and $5 \times 10^{17}$ cm$^{-3}$, for example.

The introduction of selenium atoms in the sidewalls of the contact holes may be carried out e.g. through angular (oblique) implantation or through plasma deposition. Selenium atoms implanted in the trench floor may be removed through an anisotropic etching, or with a high dosage acceptor implantation and/or acceptor implantation over doping with one or more appropriate implantations energy. Through lateral angling and/or lateral under diffusion, the additional acceptor implantation (of the body region) may further weaken the emitter efficiency of the selenium doped regions. The activation of the implantation may be achieved by relatively low temperatures (e.g. under 600° C.) or through rapid thermal annealing, to avoid a substantial redistribution of the implanted selenium atoms.

The electric active effective (e.g. overall net) doping concentration (e.g. an average or maximal doping concentration) $|N_D-N_A|$ of the atoms used for source region (e.g. P and/or As) may lie in the region of the doping concentration (e.g. an average or maximal doping concentration) of the adjacent body region (e.g. about $1 \times 10^{17}$ cm$^{-3}$). $N_D$ may represent a concentration of donor atoms and $N_A$ may represent a concentration of acceptor atoms, for example. For example, the electrically active effective doping concentration of the source region may be lower than (e.g. about $8 \times 10^{16}$ cm$^{-3}$), approximately equal to or preferably not more than a factor of 3 times higher than the doping concentration of the adjacent body region, e.g. less than 80% higher, or e.g. less than 30% higher. On one hand, the emitter efficiency of the source region may be relatively low and on the other hand the source region in the conducting state may have a voltage drop which is significantly lower than the voltage drop in the drift region. Further, a tendency to current filamentation may be reduced by an increased voltage drop in the source region, because this additional voltage drop may counteract current filamentation.

Defects on the front side of the semiconductor surface may lead to a poor local contact which may lead to a negligible increase in the $V_{CEsat}$. However, critical defects during the p$^+$-conductivity enhancement implantation which may lead to a significant degradation of the latch-up behavior no longer necessarily play a role due to the local highly doped p-doped region under the source zone being missing or having a lower doping, for example. This may be due to the lower emitter efficiency of the n$^-$ source region. The p$^+$-conductivity enhancement implantation (p-body doping increase implant) may be an additional implant into the body region to increase the body doping within a part of the body region. The part of the body region with increased doping may be located below the source region and with a distance of more than 200 nm to the gate trench (e.g. to avoid an alteration of the threshold of the transistor). The manufacturing cost may be reduced, if the p$^+$-conductivity enhancement implantation may be avoided.

A temperature load or stress caused by the annealing of the p$^+$-conductivity enhancement implantation may be reduced due to the lower emitter efficiency or the p$^+$-conductivity enhancement implantation may be completely avoided. For example, the temperature stress may be partially or even fully eliminated if the conductivity enhancement implantation is not necessary due to the lower source implantation dosage. This may lead to positive side effects for a reverse conducting IGBT. For example, hole injection in the inverse diode may be significantly reduced.

More details and aspects are mentioned in connection with the embodiments described above or below. The embodiments shown in FIG. 2 may comprise one or more optional additional features corresponding to one or more aspects mentioned in connection with the proposed concept or one or more embodiments described above (e.g. FIG. 1A) or below (e.g. FIGS. 2 to 4).

Figure 2:
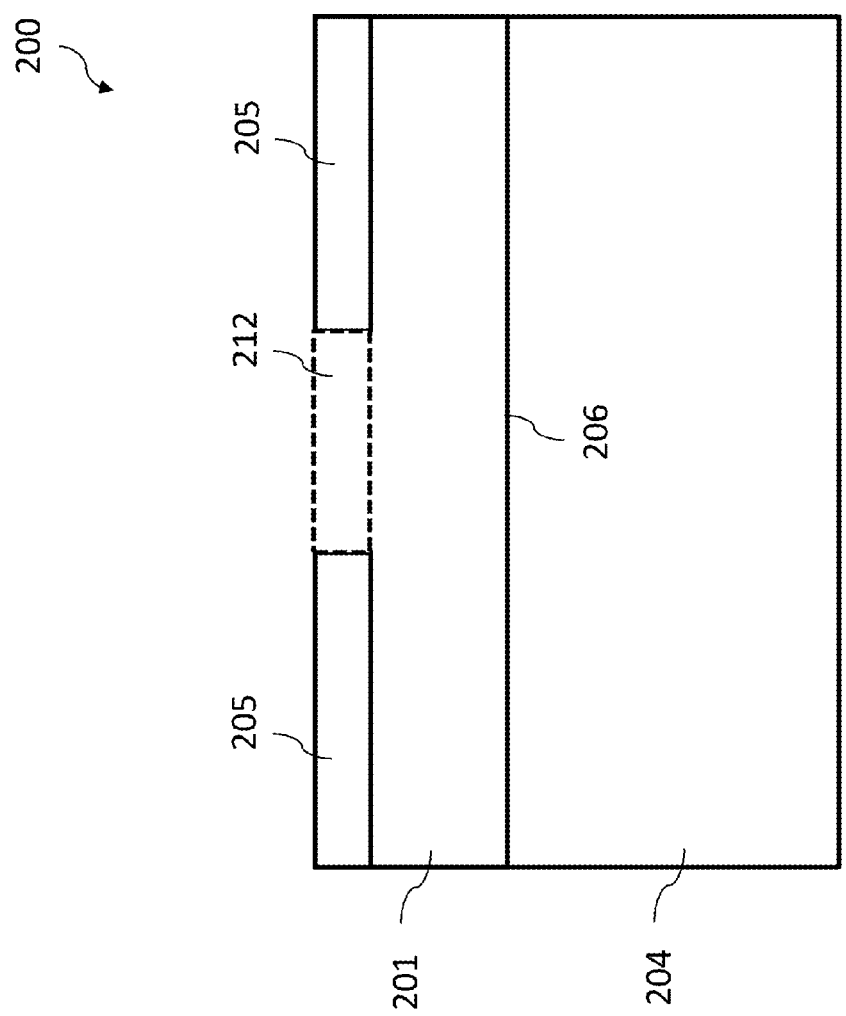
FIG. 2 shows a schematic illustration of a semiconductor device according to various embodiments.

FIG. 2 shows a schematic illustration of a semiconductor device 200 according to an embodiment.

The semiconductor device 200 includes a body region 201 of a field effect transistor structure formed between a drift region 204 of the field effect transistor structure and a source region 205 of the field effect transistor structure. The semiconductor substrate includes chalcogen atoms at an atom concentration of less than $1 \times 10^{13}$ cm$^{-3}$ at a p-n junction between the body region 201 and the drift region 204. At least part of the source region 205 includes the chalcogen atoms at an atom concentration of greater than $1 \times 10^{13}$ cm$^{-3}$ or greater than $1 \times 10^{14}$ cm$^{-3}$ or greater than $1 \times 10^{15}$ cm$^{-3}$ or greater than $1 \times 10^{16}$ cm$^{-3}$ or greater than $1 \times 10^{17}$ cm$^{-3}$ or greater than $1 \times 10^{18}$ cm$^{-3}$.

Due to semiconductor substrate having chalcogen atoms at an atom concentration of less than $1 \times 10^{13}$ cm$^{-3}$ at the p-n junction 206, blocking capabilities and robustness against latch-up in the semiconductor device may be improved as a very low number of chalcogen atoms are present in the drift region and in region (e.g. the p-n junction) between the body region and the drift region, for example. As the number of chalcogen atoms present in these areas remains low, the maximum field strength remains low, thus reducing the effects of avalanche in the semiconductor device, for example. Due to at least part of the source region having chalcogen atoms at an atom concentration of greater than $1 \times 10^{13}$ cm$^{-3}$, no enhancement in the contact resistance (e.g. between a source electrode and the source region) is experienced even if source doping is reduced. For example, an ohmic contact may be formed between the source electrode and the source region. Furthermore, the emitter efficiency may be kept very low and robustness against latch-up may be improved, for example.

The semiconductor device 200 may be similar to the semiconductor device formed according to the method described with respect to FIGS. 1A and 1B. For example, the semiconductor device 200 may include one or more or all of the features already described with respect to the semiconductor device of FIG. 1A.

In some examples, an atom concentration of chalcogen atoms (e.g. Se atoms) at a surface region of the source region 205 may be greater than $1 \times 10^{13}$ cm$^{-3}$ or greater than $1 \times 10^{14}$ cm$^{-3}$ or greater than $1 \times 10^{15}$ cm$^{-3}$ or greater than $1 \times 10^{16}$ cm$^{-3}$ or greater than $1 \times 10^{17}$ cm$^{-3}$ or greater than $1 \times 10^{18}$ cm$^{-3}$. The surface region may have a thickness of less than 150 nm, e.g. 100 nm, from a surface of the source region 205, for example.

The source region 205 may further include electrically active atoms of a first dopant type (e.g. P, As) at a doping concentration (e.g. average or maximal doping concentration) of less than $1 \times 10^{18}$ cm$^{-3}$, e.g. between $5 \times 10^{17}$ cm$^{-3}$ and $1 \times 10^{19}$ cm$^{-3}$. A ratio of the doping concentration of the chalcogen atoms in the source region to the doping concentration of electrically active atoms of the first dopant type in the source region lies between 1:10 and 1:2 (e.g. between 10% and 50%), for example.

The body region 201 may include dopant atoms of a second dopant type (e.g. B, Al) at a doping concentration of e.g. $1 \times 10^{17}$ cm$^{-3}$ or several times $10^{17}$ cm$^{-3}$ or more than $1 \times 10^{18}$ cm$^{-3}$.

The source region 205 may include an effective doping concentration (e.g. at the surface region or average over the source region) of not more than three times greater than an effective doping concentration (e.g. average doping concentration) of the body region 201. For example, the electrically active effective doping concentration $|N_D - N_A|$ of the source region may be lower than, approximately equal to or preferably not more than a factor of 3 times higher than the effective doping concentration of the adjacent body region, e.g. less than 80% higher, or e.g. less than 30% higher. For example, the effective doping concentration may lie between $1 \times 10^{17}$ and $5 \times 10^{18}$ cm$^{-3}$, for example.

The semiconductor device 200 may further including an electrode structure 212 (e.g. a source electrode) forming an ohmic contact with the source region 205 and/or the body region 201.

Due to the relatively low doping of the source zone with dopant atoms of the first dopant type (e.g. with Phosphor and/or Arsenic atoms), a lower emitter efficiency of the n-type source and p-body junction may be achieved. Furthermore, by incorporating atoms of the first atom type (e.g. Se) into the source region, the ohmic contact may be realized at the low doped source zone, e.g. even though the source region is lowly doped with dopant atoms. Furthermore, incorporating atoms of the first atom type (e.g. Se) atoms into the side walls of the contact trench may lead to a plurality of additional levels in the energy gap of the semiconductor material, which in turn may leads to a very low contact resistance.

More details and aspects are mentioned in connection with the embodiments described above or below. The embodiments shown in FIG. 2 may comprise one or more optional additional features corresponding to one or more aspects mentioned in connection with the proposed concept or one or more embodiments described above (e.g. FIGS. 1A and 1B) or below (e.g. FIGS. 3 to 4).

Figure 3:
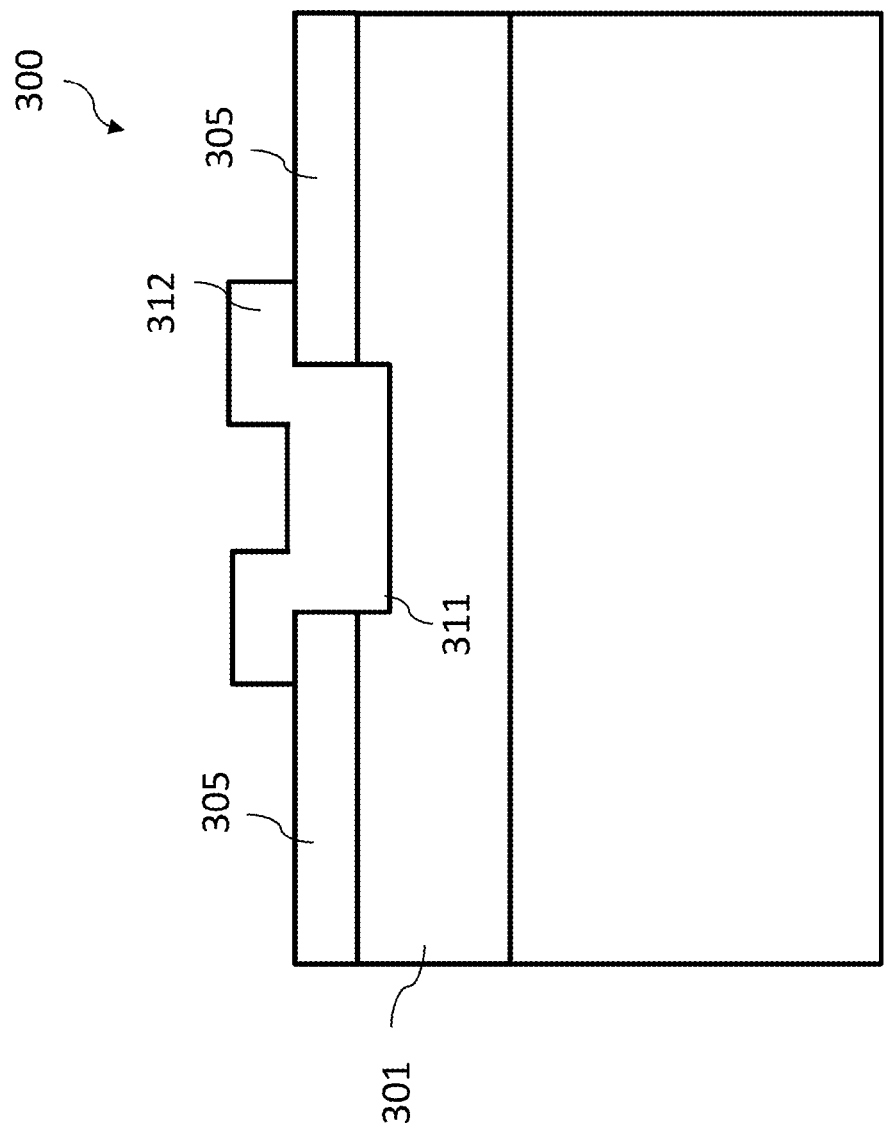
FIG. 3 shows a schematic illustration of a semiconductor device with a contact trench according to various embodiments.

FIG. 3 shows a schematic illustration of a semiconductor device 300 according to an embodiment.

The semiconductor device 300 includes a body region 301 of a field effect transistor structure formed in a semiconductor substrate and a source region 305 formed adjacent to the body region 301. At least part of the source region 305 includes chalcogen atoms at an atom concentration of greater than $1 \times 10^{13}$ cm$^{-3}$ or greater than $1 \times 10^{14}$ cm$^{-3}$ or greater than $1 \times 10^{15}$ cm$^{-3}$ or greater than $1 \times 10^{16}$ cm$^{-3}$ or greater than $1 \times 10^{17}$ cm$^{-3}$ or greater than $1 \times 10^{18}$ cm$^{-3}$. The semiconductor device 300 further includes a contact trench 311 extending into the semiconductor substrate. The semiconductor device 300 further includes an electrode structure 312 formed in the contact trench 311. The electrode structure 312 is in contact with the body region 301 at the bottom of the contact trench 311 and in contact with the source region 305 at a sidewall of the contact trench 311.

Due to the contact trench extending in the semiconductor substrate and the electrode structure being formed in the contact trench, latch-up robustness in the semiconductor device may be improved as chalcogen atoms may be incorporated into a surface region of the source region and the doping level of the source zone 305 may be reduced. Furthermore, both the source region and the body region may be contacted by the same electrode structure, resulting in a more efficient and simpler semiconductor device fabrication process, for example.

The source region 305 may build up or define at least a part of the sidewall of the contact trench 311. The body region may build up or define at least a part of a bottom of the contact trench 311.

The semiconductor device 300 may be similar to the semiconductor device formed according to the method described with respect to FIGS. 1A and 1B and similar to the semiconductor device described with respect to FIG. 2. For example, the semiconductor device 300 may include one or more or all of the features already described with respect to the semiconductor devices of FIGS. 1 and 2.

More details and aspects are mentioned in connection with the embodiments described above or below. The embodiments shown in FIG. 3 may comprise one or more optional additional features corresponding to one or more aspects mentioned in connection with the proposed concept or one or more embodiments described above (e.g. FIG. 1 or 2) or below (e.g. FIG. 4).

Figure 4:
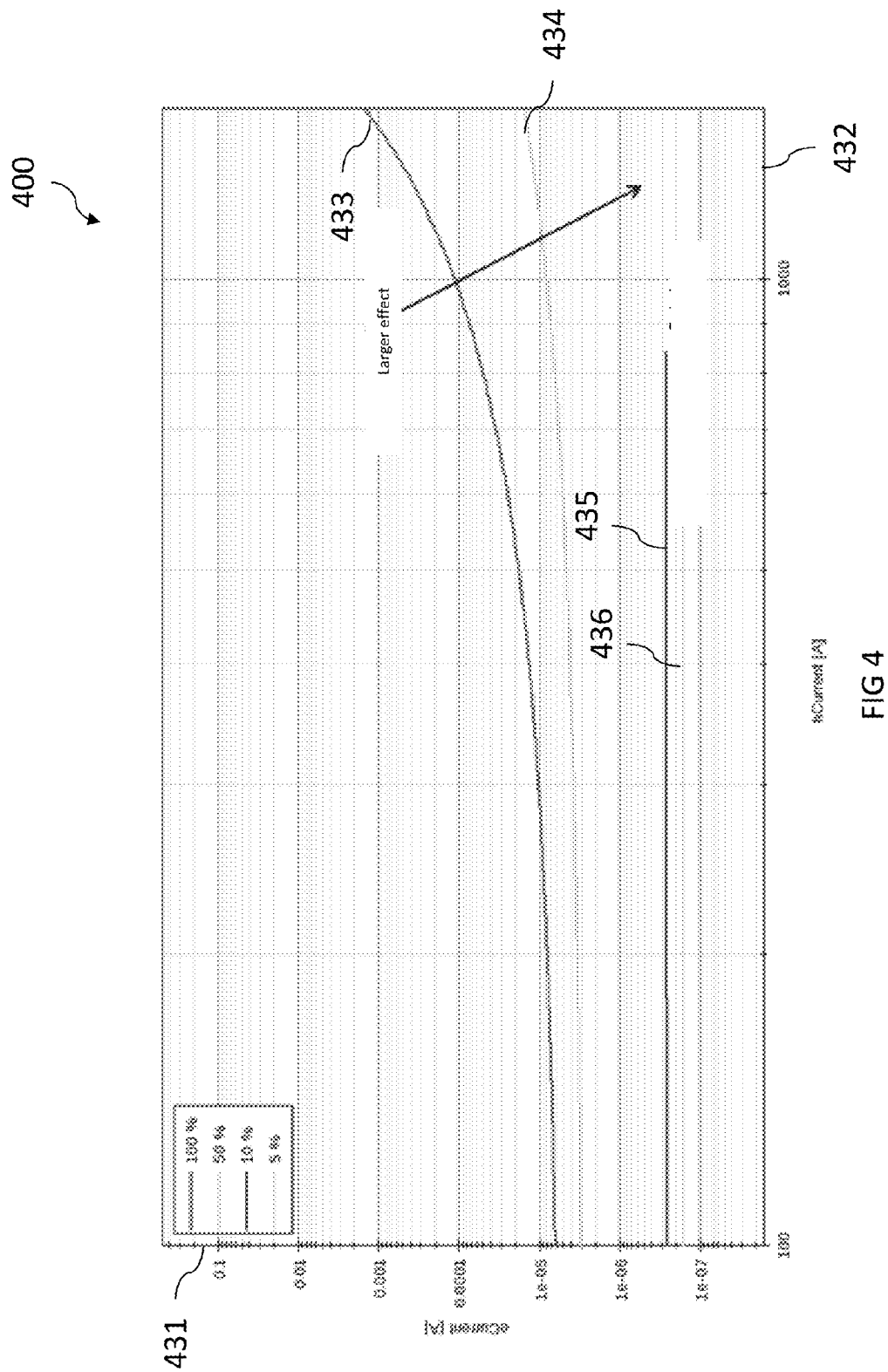
FIG. 4 shows a plot of injection electron current with respect to source region doping concentration.

FIG. 4 shows a plot 400 of injection electron current (A) 431 vs hole current (A) 432 and their dependence on different source doping concentration (e.g. compared with 100% of original source doping level 433, reduced to 50% of the original source doping level 434, reduced to 10% of the original source doping level 435 and reduced to 5% of the original source doping level 436) with the same body doping concentration. The injection electron current may be reduced (e.g. from 1 mA to $3 \times 10^{-6}$ A) when the source doping is reduced by 50%, leading to an improvement in latch-up robustness, for example. A larger effect is experienced at higher hole currents (e.g. about 1000 A). For example, the reduction in injection electron current resulting when the source doping is reduced by 50% compared to the original source doping level is much greater at higher hole currents (e.g. about 1000 A) than at hole currents between 100 A to 300 A.

A component simulation may show the influence of a reduction of the source region doping concentration on the injection of electrons through the source region during the FET off-state. The electron current density (e-current) without reducing source doping (100%) and the electron current density with source doping reduced by 50% may show that the electron current density decreases significantly when the source doping is reduced by 50%. Additionally, the emitter efficiency is reduced. Therefore, latch-up effects may be significantly reduced with lower source doping made possible by the incorporation of atoms of the at least one atom type in the source region resulting in a low contact resistance, for example. The doping concentration of the body doping is the same in both cases (e.g. 100% and 50%), for example.

More details and aspects are mentioned in connection with the embodiments described above or below. The embodiments shown in FIG. 4 may comprise one or more optional additional features corresponding to one or more aspects mentioned in connection with the proposed concept or one or more embodiments described above (e.g. FIGS. 1 to 3) or below (e.g. FIG. 4).

Aspects and features (e.g. the field effect transistor structure, the source region, the surface region of the source region, the semiconductor substrate, the oxide layer, the at least one atom type, the group of atom types, the body region, the drift region, the field stop region, the float region, the emitter region, the oxide layer, the insulation structure, the gate electrode structure, the gate trench, the gate insulation layer, the source electrode, the drain electrode, the contact trench, and the electrode structure) mentioned in connection with one or more specific examples may be combined with one or more of the other examples.

Various embodiments relate to a method for manufacturing an IGBT with improved latch-up robustness and cosmic radiation robustness.

Various embodiments relate to improving latch-up robustness, over-current switching capability and cosmic radiation robustness in IGBTs. Doping adjustments may be carried out to adjust characteristics of the doping regions of the transistor structures. The various embodiments described herein may reduce or prevent the uncontrolled spreading of dopants in the semiconductor substrate which may negatively influence the blocking capabilities of the transistor.

Various embodiments relate to improving cosmic radiation from CoolMOS™ components.

Various embodiments relate to the introduction of selenium atoms in the side walls of the contact hole of IGBTs or Power MOSFETs and at the same time a significant reduction of the source doping of the component.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A method for forming a semiconductor device, the method comprising:
   forming a source region of a field effect transistor structure in a semiconductor substrate;
   forming an oxide layer on the source region;
   forming a contact trench in the semiconductor substrate, the contact trench extending through the source region and defining a side face of the source region, the side face of the source region forming part of a sidewall of the contact trench; and
   implanting chalcogen atoms through an opening in the oxide layer and into the side face of the source region.

2. The method of claim 1, wherein more than 50% of the chalcogen atoms are incorporated into a surface region of the source region, wherein the surface region has a thickness of less than 150 nm.

3. The method of claim 1, wherein incorporating the chalcogen atoms into the side face of the source region comprises implanting the chalcogen atoms at an oblique implantation angle with respect to a main surface of the semiconductor substrate.

4. The method of claim 1, wherein forming the source region comprises incorporating dopant atoms of a first dopant type into a region of the semiconductor substrate before forming the oxide layer.

5. The method of claim 1, wherein a surface of a body region of the semiconductor substrate forms at least a part of a bottom of the contact trench.

6. The method of claim 5, further comprising etching at least part of the body region at the bottom of the contact trench after incorporating the chalcogen atoms.

7. The method of claim 5, further comprising incorporating dopant atoms of a second dopant type into the body region at the bottom of the contact trench after incorporating the chalcogen atoms.

8. The method of claim 1, further comprising tempering the oxide layer at a temperature of more than 900° C. before incorporating the chalcogen atoms.

9. The method of claim 1, further comprising forming a gate trench adjacent to the source region and a body region of the semiconductor substrate.

10. The method of claim 1, wherein the oxide layer is formed on at least part of a gate electrode structure formed on at least part of the semiconductor substrate.

11. The method of claim 1, wherein the chalcogen atoms are selenium atoms.

12. The method of claim 1, wherein implantation doses for the chalcogen atoms lie in the range between $5 \times 10^{13}$ and $4 \times 10^{15}$ atoms per $cm^2$.

13. The method of claim 1, wherein all processes after incorporating the chalcogen atoms are performed at temperatures below 800° C.

* * * * *